United States Patent
Malouin et al.

(10) Patent No.: US 11,277,937 B2
(45) Date of Patent: Mar. 15, 2022

(54) RE-ENTRANT FLOW COLD PLATE

(71) Applicant: Jetcool Technologies Inc., Littleton, MA (US)

(72) Inventors: Bernard Malouin, Westford, MA (US); Jordan Mizerak, Boston, MA (US)

(73) Assignee: Jetcool Technologies Inc., Littleton, MA (US)

(*) Notice: Subject to any disclaimer, the term of this patent is extended or adjusted under 35 U.S.C. 154(b) by 0 days.

(21) Appl. No.: 16/943,325

(22) Filed: Jul. 30, 2020

(65) Prior Publication Data
US 2021/0037676 A1  Feb. 4, 2021

Related U.S. Application Data (60) Provisional application No. 62/977,552, filed on Feb. 17, 2020, provisional application No. 62/880,947, filed on Jul. 31, 2019.

(51) Int. Cl.
H05K 7/20 (2006.01)

(52) U.S. Cl.
CPC ..... *H05K 7/20254* (2013.01); *H05K 7/20263* (2013.01); *H05K 7/20272* (2013.01); *H05K 7/20281* (2013.01)

(58) Field of Classification Search
CPC .......... H05K 7/20254; H05K 7/20263; H05K 7/20272; H05K 7/20281
USPC ........................................................ 361/699
See application file for complete search history.

(56) References Cited

U.S. PATENT DOCUMENTS

| | | | | |
|---|---|---|---|---|
| 5,021,924 A * | 6/1991 | Kieda | ................. | H01L 23/4336 165/104.33 |
| 5,285,351 A * | 2/1994 | Ikeda | ................... | H01L 23/433 165/104.33 |
| 5,309,319 A * | 5/1994 | Messina | ............. | H01L 23/4336 165/142 |
| 5,316,075 A * | 5/1994 | Quon | ...................... | F28F 13/02 165/104.33 |
| 5,349,831 A * | 9/1994 | Daikoku | ............... | H01L 23/427 165/80.4 |
| 5,959,351 A * | 9/1999 | Sasaki | ................... | H01L 23/473 257/714 |
| 6,550,263 B2 * | 4/2003 | Patel | ................... | H01L 23/4735 165/80.4 |
| 7,104,312 B2 * | 9/2006 | Goodson | ............... | F04B 19/006 165/104.33 |
| 7,233,494 B2 * | 6/2007 | Campbell | .......... | H01L 23/4735 165/80.4 |

(Continued)

FOREIGN PATENT DOCUMENTS

WO   2019/018597 A1   1/2019

OTHER PUBLICATIONS

The International Search Report and The Written Opinion of the International Searching Authority dated Oct. 14, 2020 for PCT Application No. PCT/US20/44220.

*Primary Examiner* — Anatoly Vortman
(74) *Attorney, Agent, or Firm* — Grady L. White; Potomac Law Group, PLLC (57) ABSTRACT

A fluid-cooled re-entrant cold plate for thermal management of heat dissipating electronic devices or assemblies. The fluid leaves the cold plate's outer perimeter, fills a sealed cavity between the cold plate outer perimeter and the mating component/assembly, provides direct cooling of the electronic component, then re-enters the cold plate.

19 Claims, 9 Drawing Sheets

(56) References Cited

U.S. PATENT DOCUMENTS

| | | | | |
|---|---|---|---|---|
| 7,511,957 B2* | 3/2009 | Campbell | ............... | F28C 3/08 |
| | | | | 165/80.4 |
| 7,866,173 B2* | 1/2011 | Brunschwiler | ......... | G06Q 10/06 |
| | | | | 62/185 |
| 7,916,483 B2* | 3/2011 | Campbell | ........ | H05K 7/20236 |
| | | | | 361/702 |
| 8,266,802 B2* | 9/2012 | Campbell | .......... | H01L 23/4735 |
| | | | | 29/890.03 |
| 9,247,672 B2 | 1/2016 | Mehring | | |
| 9,653,378 B2* | 5/2017 | Hou | .................. | H01L 23/473 |
| 9,903,664 B2* | 2/2018 | Joshi | ................. | H01L 23/4735 |
| 10,228,735 B2* | 3/2019 | Kulkarni | ............ | H01L 23/3672 |
| 10,985,089 B2* | 4/2021 | Hart | ................ | H01L 23/14 |
| 2007/0091569 A1 | 4/2007 | Campbell et al. | | |
| 2007/0272392 A1 | 11/2007 | Ghosh et al. | | |
| 2007/0295480 A1 | 12/2007 | Campbell et al. | | |
| 2008/0278913 A1* | 11/2008 | Campbell | ............... | F28C 3/08 |
| | | | | 361/699 |
| 2009/0032937 A1* | 2/2009 | Mann | ............... | H01L 23/4735 |
| | | | | 257/712 |
| 2010/0328882 A1* | 12/2010 | Campbell | ............ | H01L 23/427 |
| | | | | 361/689 |
| 2012/0048515 A1* | 3/2012 | Bhunia | ............. | H01L 23/3735 |
| | | | | 165/104.25 |
| 2012/0160459 A1* | 6/2012 | Flotta | ............... | H05K 7/20772 |
| | | | | 165/104.27 |
| 2012/0212907 A1 | 8/2012 | Dede | | |
| 2017/0092565 A1* | 3/2017 | Chen | ................... | H01L 23/473 |

* cited by examiner

RE-ENTRANT FLOW COLD PLATE

CROSS-REFERENCE TO RELATED APPLICATIONS

This application claims priority of Provisional Application 62/880,947 filed on Jul. 31, 2019, and of Provisional Application 62/977,552 filed on Feb. 17, 2020.

BACKGROUND

Electronic devices are powering some of today's biggest innovations in areas of wireless communications, electric vehicles, and computer processing. An enabling factor in many of these applications has been the advancement of higher performance electronics in smaller package sizes. This has increased the power-density of the devices, which can be challenging for the associated thermal management systems. Previous approaches implemented large, finned heat sinks and fans to cool individual components or assemblies of components (e.g., a printed circuit board or PCB). While these approaches offer an appealing simplicity, their modest performance is quickly becoming insufficient for today's power-dense devices.

Current approaches to cooling these types of devices and assemblies are increasingly favoring fluid-cooled cold plates. Cold plates have been comprised of a thermally conductive material (typically a metal) in the form of a flat plate. Components/assemblies are then mounted to this plate, with a thermal interface material between the two. Within the cold plate passes a coolant fluid. Heat from the components/assemblies is then conducted through the thermal interface material and cold plate material to ultimately be transferred to the coolant fluid. Such approaches offer higher performance than fan-based systems. However, they are still limited by the conduction through the thermal interface material and the plate itself. Additionally, the metal plates can be heavy, which then presents a difficult tradeoff between weight and performance in electric vehicle, aircraft, and space applications.

It would, therefore, be useful to have a cold plate that: offers even higher performance for the hottest components; minimizes thermal gradients between components of different power levels within the assembly; and can be made lighter weight.

SUMMARY

All examples and features mentioned below can be combined in any technically possible way.

In one aspect, a re-entrant cold plate for cooling an electronic component includes one or more internal fluid passages, at least one fluid supply inlet port that is fluidly coupled to the internal fluid passage, at least one fluid discharge outlet port that is fluidly coupled to the internal fluid passage, and a well in the cold plate and fluidly coupled to the internal fluid passage, wherein the well is exposed to the external environment.

Some examples include one of the above and/or below features, or any combination thereof. In an example at least one side of the well is formed by at least one exterior surface of the cold plate. In an example at least one side of the well is formed by a surface of an electronic component to be cooled. In an example fluid in the well directly contacts at least one surface of an electronic component to be cooled. In an example only the well is between the electronic component to be cooled and the cold plate.

Some examples include one of the above and/or below features, or any combination thereof. In some examples the cold plate further comprises a nozzle plate to form fluid jets that issue into the well. In an example the nozzles are non-uniformly configured, to reduce temperature gradients across the electronic component. In an example the nozzles are non-uniformly distributed. In an example the nozzles are non-uniform in size. In an example the nozzles contain geometric features for enhanced fluid flow.

Some examples include one of the above and/or below features, or any combination thereof. In an example the re-entrant cold plate also includes a fluid-tight seal between the cold plate and the electronic component. In an example the fluid-tight seal comprises an elastomeric O-ring or gasket. In an example the well is configured with a fluid inlet that is fluidly coupled to a first internal fluid passage and a fluid outlet that is spaced from the fluid inlet and fluidly coupled to a second internal fluid passage. In an example all of the fluid flowing through the internal fluid passages flows through the well. In an example only some of the fluid flowing through the internal fluid passages flows through the well.

Some examples include one of the above and/or below features, or any combination thereof. In some examples the re-entrant cold plate includes a plurality of separate wells in the cold plate. In an example two of the wells are arranged in series such that fluid flows through one well and then through the second well. In an example two of the wells are arranged in parallel such that no fluid flows through both wells. In an example at least one other electronic component is mounted to the cold plate away from the well and is configured to be cooled by fluid in an internal fluid passage. In an example the re-entrant cold plate is fabricated using additive manufacturing. In an example the re-entrant cold plate is made from a non-metal material.

In another aspect, a re-entrant cold plate for cooling electronic components includes one or more internal fluid passages, at least one fluid supply inlet port that is fluidly coupled to the internal fluid passage, at least one fluid discharge outlet port that is fluidly coupled to the internal fluid passage, a well in the cold plate and fluidly coupled to the internal fluid passage, wherein at least one side of the well is formed by at least one exterior surface of the cold plate, wherein at least one side of the well is formed by a surface of an electronic component to be cooled, wherein fluid in the well directly contacts at least one surface of the electronic component to be cooled, and wherein only the well is between the electronic component to be cooled and the cold plate, and a fluid-tight seal between the cold plate and the electronic component. In an example the cold plate also includes a nozzle plate to form fluid jets that issue into the well.

In another aspect, an assembly includes a re-entrant cold plate with a well in an external surface thereof and an electronic device or electronic assembly exposed to the well and that is cooled using re-entrant fluid flow that passes through the cold plate and through the well.

BRIEF DESCRIPTION OF THE DRAWINGS

For a better understanding of the present disclosure, reference is made to the accompanying drawings, in which.

DETAILED DESCRIPTION

This disclosure describes the use of a cold plate that produces increased heat transfer performance by allowing a coolant fluid to pass through the cold plate surface, directly contact the heat-generating device, and re-enter the cold plate again. The disclosure further describes several beneficial features of this "re-entrant flow" cold plate, including the ability to effectively cool high and low power components within a single assembly, the ability to reduce or eliminate thermal gradients across assemblies with components of disparate power dissipations, and the ability to eliminate the need for cold plates with thermally-conductive materials—thereby greatly reducing weight while preserving performance.

The disclosure further describes several possible embodiments of the re-entrant flow cold plate, including internal geometry architectures to achieve high performance re-entrant flow cold plates and some examples of assemblies containing re-entrant flow cold plates. This disclosure adds new features (re-entrant flow) to a common thermal management approach (cold plates) in order to achieve higher performance and relax material constraints.

Figure 1:
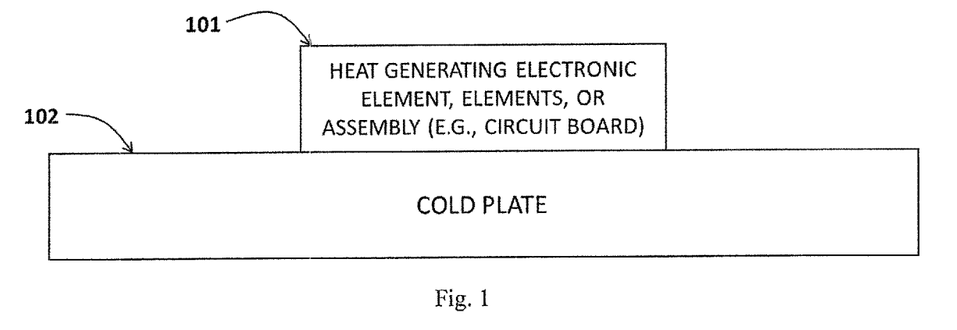
FIG. 1 shows a conceptual schematic for a component or assembly on a cold plate.

Many system level assemblies are comprised of multiple components, including many electrical/electronic components and/or printed circuit boards (PCBs). These system level assemblies often include thermal management hardware, such as fans, heat spreaders, or cold plates. Such an arrangement is shown in FIG. 1, where one or more heat generating elements or assemblies (101) are disposed on a cold plate (102).

In the case of cold plates, a coolant fluid is circulated within a thermally conductive plate. Heat-dissipating components and/or assemblies are then attached to the outer surface of the cold plate, typically by a thermal interface material (TIM). This TIM is commonly an elastomeric pad, thermal epoxy, or a thermal paste. The TIM fills in the small area between the component surface and the cold plate surface, area which would otherwise be occupied by very low conductivity air. In this way, heat that is generated from the component is conducted to the component's outer surface, then through the TIM, then through the conductive surface of the cold plate, and ultimately transferred into the coolant fluid buried within the cold plate.

Figure 2:
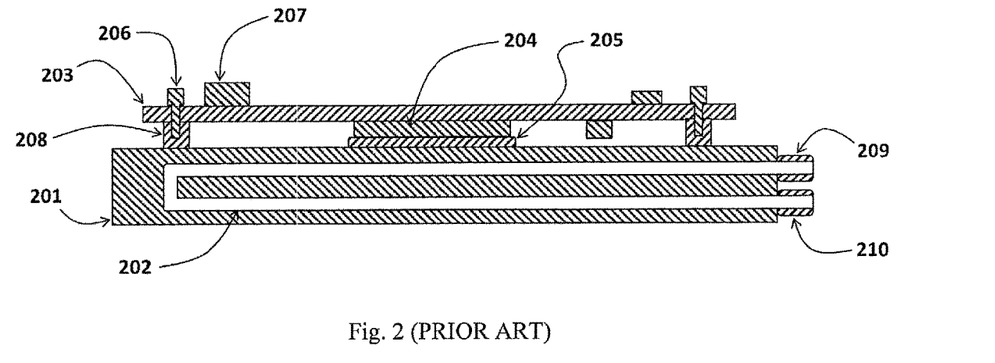
FIG. 2 shows a cross sectional view of a prior art cold plate with internal fluid passages, designed to cool a printed circuit board assembly.

FIG. 2 illustrates such a prior art cold plate assembly. A thermally conductive cold plate (201) has contained within it one or more fluid passages (202). Coolant fluid flows through these passages, from an inlet (209) to an outlet (210), cooling the cold plate (201). In many instances, a printed circuit board (203) is disposed onto the cold plate, perhaps by fasteners (206) into the cold plate itself or standoffs (208). The PCB (203) has disposed on it at least one high power component (204), and may have one or more other components (207). When the PCB is fastened to the cold plate, contact is made between any high power components (204) and the cold plate (201) surface by a layer of TIM (205).

In this architecture, the heat dissipated by the high power component (204) must be conducted to the outer surface of the component itself, through the TIM layer (205), and through the top layer of the cold plate (201) before finally being discharged to the coolant fluid (202). This lengthy path from heat generation to heat disposal, which includes a low conductivity TIM, leads to significant temperature buildup. For context, even high performance TIMs have thermal conductivities around 5 W/m-K, which is significantly less than standard materials like aluminum (235 W/m-K). Therefore, the need for these TIM layers is detrimental to the overall thermal performance.

Figure 3:
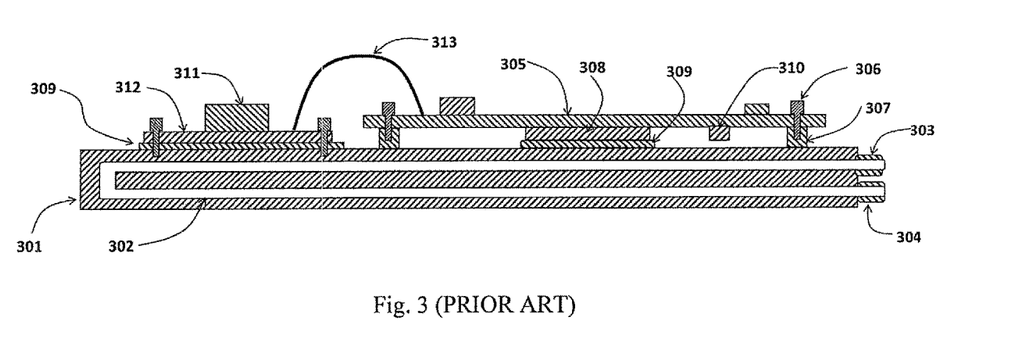
FIG. 3 shows a cross sectional view of a prior art cold plate with internal fluid passages, designed to cool a component and a printed circuit board assembly.

Of course, cold plates can also be used with even larger assemblies such as those shown in FIG. 3 where the cold plate (301) is the structural and thermal support for a printed circuit board (305) and a standalone component (311+312). Here, the prior art cold plate (301) still includes within it one or more fluid passages (302) that pass coolant fluid from the inlet (303) to the outlet (304). The PCB (305) is disposed on the cold plate by fasteners (306) into standoffs (307). A high power component (308) is disposed on the board, again with a TIM layer (309) being used to create contact with the cold plate surface. Also disposed on the cold plate is a standalone high power component (311) that comes packaged with a mounting handle (312). The standalone component and the PCB may be independent, or may be electrically linked, for instance, by wires (313).

Figure 4:
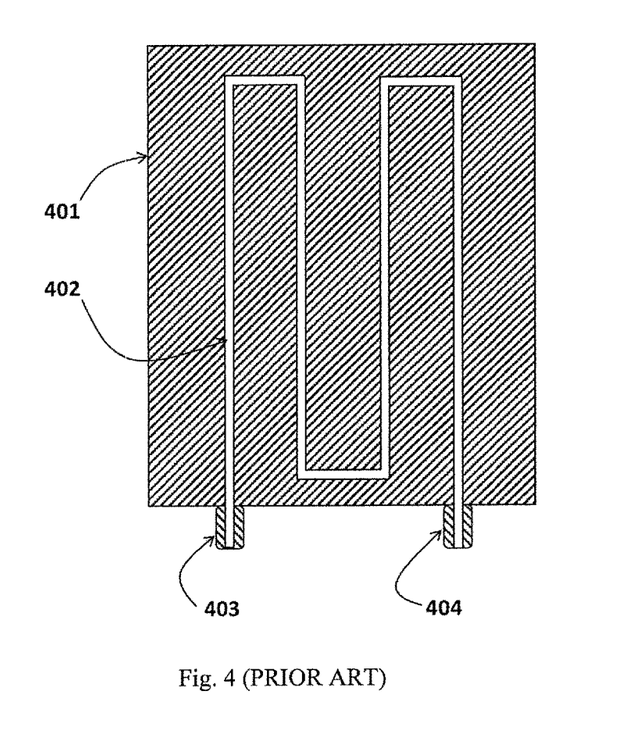
FIG. 4 shows a top view of the internal fluid passages within a prior art cold plate.

Within prior art cold plates, coolant fluid is circulated in a variety of passage geometries. FIG. 4 illustrates one such internal flow geometry. Within the prior art cold plate (401), there exist fluid passages (402) that route coolant fluid from the inlet (403) to the outlet (404) fitting.

The above approach is effective for transferring the heat from moderately powered components. However, for high power components the thermal losses of conducting through the TIM are significant—and the heat must further traverse through a layer of the cold plate itself before reaching the fluid. Moreover, even for low power components, the traditional cold plate design requires the cold plate surface to be thermally conductive, restricting its construction largely to metals with a significant impact on weight.

This disclosure describes a re-entrant flow cold plate for electronics cooling. The re-entrant flow cold plate produces high performance cooling by allowing the fluid to exit through the surface of the cold plate to contact the component directly. No TIM layer is needed. This eliminates the losses typically associated with the TIM layer. The fluid then re-enters the cold plate for more general cooling of the plate or other components. Additionally, since the re-entrant fluid has been used to transfer the component's heat while not within the extents of the cold plate, there is no longer a need for the cold plate to be made from thermally conductive materials which allows for the use of much lighter weight materials such as plastics. Such freedom in material choice also allows other benefits, such as the use of materials with matching coefficients of thermal expansion (CTE). The ability to have a cold plate with a matched CTE to the electronics attached to it can greatly reduce the stresses that occur in the sensitive electronics.

Figure 5:
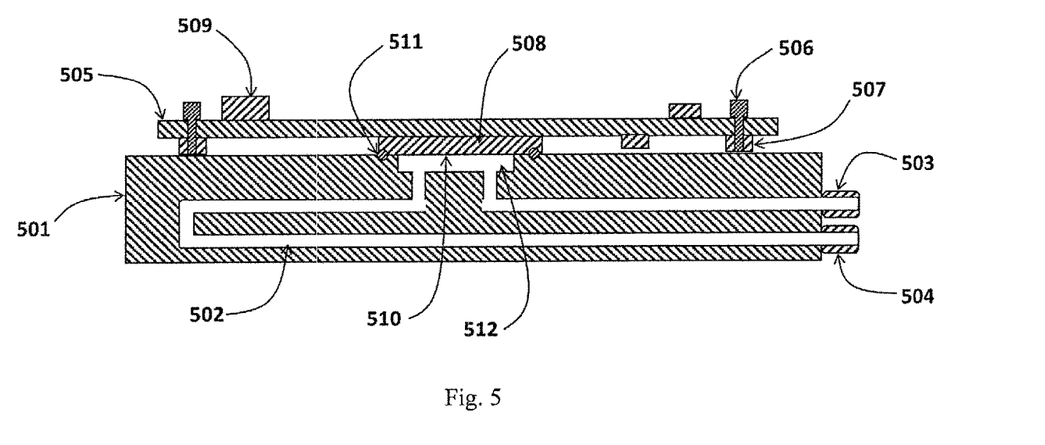
FIG. 5 shows a cross sectional view of one embodiment of a re-entrant flow cold plate, where fluid leaves the cold plate to contact the component and then returns to the cold plate.

FIG. 5 illustrates one embodiment of a re-entrant flow cold plate. The cold plate (501) has disposed within it fluid passages (502) that guide coolant fluid from an inlet (503) to an outlet (504). In this embodiment, a printed circuit board (505) is disposed on the cold plate by mechanical fasteners (506) that affix into standoffs (507), or in any other known manner. A high power component (508) is disposed on the circuit board (505). A fluid-tight seal (511) is made between the high power component (508) and the cold plate (501). Such a seal (511) may be a gasket, O-ring, epoxy, solder, or other common device/method of attachment. Elastomeric seals can be used. Of course, there may be other components (509) also disposed on the circuit board.

However, the fluid passages (502) of the re-entrant flow cold plate shown in FIG. 5 are not completely confined within the cold plate (501). Instead, the coolant fluid is able to exit the cold plate surface and fill a well (512) proximate to the cold plate (501). This well (512) is bounded on one side by the cold plate (501) and on the other side by a surface (510) of the component to be cooled (508). Thus, the well is exposed to the environment external to the cold plate. In this way, the fluid has exited the cold plate, filled the well proximate to the cold plate, transferred heat through direct contact with the component's surface, and it then re-enters the cold plate to follow the usual fluid passages (502). Notably, unlike current cold plate approaches, there is no TIM layer in this re-entrant flow cold plate configuration.

Figure 6:
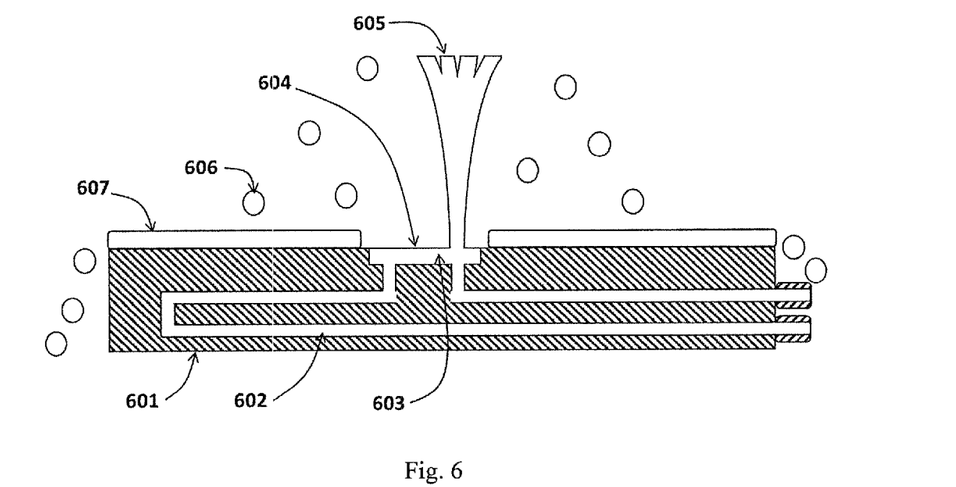
FIG. 6 illustrates improper operation of a re-entrant flow cold plate being used without a mating electronic component or assembly.

Current cold plates pass fluid from an inlet to an outlet, functioning with or without a component disposed on their surfaces. A re-entrant flow cold plate, however, does not function properly without a component disposed on at least one surface. FIG. 6 illustrates that, without a component disposed on the re-entrant flow cold plate (601), coolant fluid from the fluid passages (602) would exit the cold plate surface, with a portion of the fluid filling the well (603) and re-entering the cold plate but with another portion of fluid being ejected (605) and perhaps forming an unconfined spray (606) or loss of fluid to the surroundings (607). That is, without at least one component or other structure (such as a PCB) disposed on the re-entrant cold plate and covering the well, a portion of the fluid would not re-enter the cold plate. This is not the case for traditional cold plates.

Figure 7A:
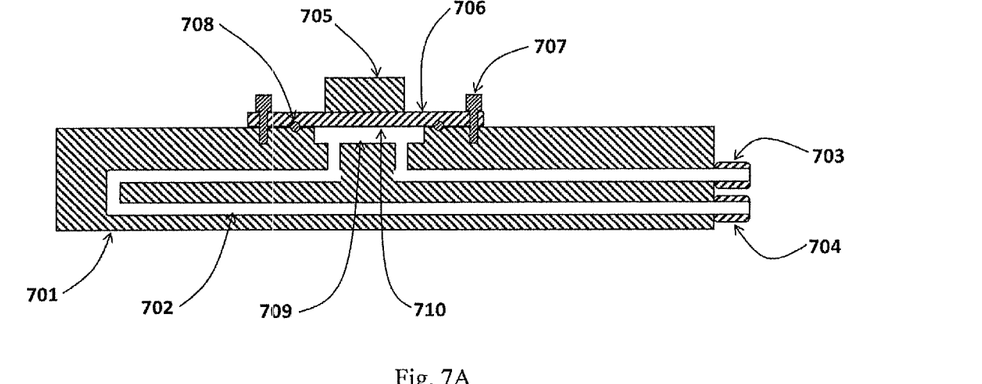
FIG. 7A and FIG. 7B show cross sectional views of a component disposed on a re-entrant flow cold plate, further illustrating how the fluid crosses the outer perimeter of the cold plate and then re-enters the cold plate.
Figure 7B:
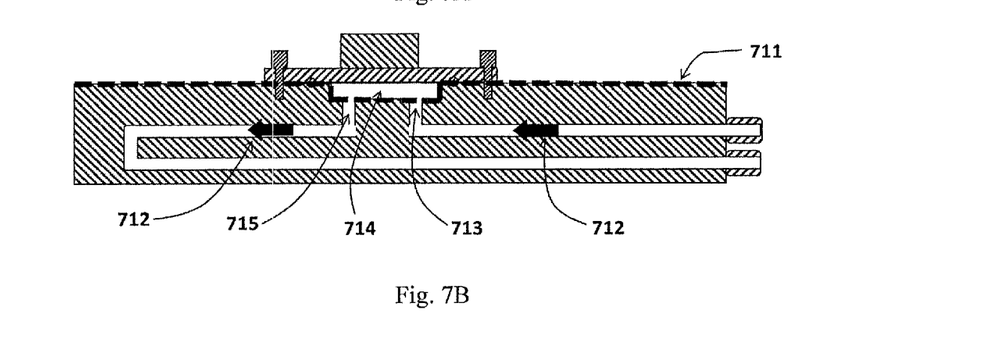

FIGS. 7A and 7B depict another embodiment of the re-entrant flow cold plate, here used with a standalone component. In FIG. 7A, the cold plate (701) features internal flow passages (702) that pass coolant fluid from an inlet (703) to an outlet (704). On this cold plate is disposed a packaged electrical device, with an electronic element (705) and its package (706). While the element's package (706) is shown as a base plate, such a package may also be a flange, case, plastic encapsulant, element-level heat spreader, or other common package type.

The re-entrant flow cold plate in FIG. 7A also features a well (709) that is proximate to the cold plate (701). Fluid from the fluid passages (702) is in communication with this external well (709), which is bounded on at least one side by the cold plate (701) surface and on at least one other side by the component element (705) or package (706). Fasteners (707) may be used to attach the component package (707) to the cold plate (701), with a fluid-tight seal (708) that may be comprised of a gasket, O-ring, elastomer, epoxy, or similar.

In this way, coolant fluid from within the cold plate passage (712) is made to exit the interior of the cold plate to perform direct cooling of the electronic device. FIG. 7B illustrates this, as fluid (712) traverses the interior of the cold plate and is then directed (713) out of the cold plate surface, crossing the outer boundary (711) of the cold plate (701) (where the outer boundary is illustrated by a dashed bold line). That is, the fluid flow leaves the cold plate, filling a well (714) between the cold plate and the electronic device. In the well, fluid contact with the electronic device effectively transfers heat from the device to the fluid, without the need for any TIM layers.

Owing to the physical boundaries of the well (714), after heat transfer between the electronic device and the fluid, the fluid is then forced to re-enter (715) the cold plate for further usage or disposition within the internal fluid passage (712). That is, the fluid from the cold plate has exited the cold plate's outer boundary, filling a well where heat transfer occurs, and then re-enters the cold plate.

Another benefit of the re-entrant flow cold plate can also be seen in FIG. 7A. The primary heat transfer with the high power device (705+706) occurs when the fluid has exited the cold plate (701) and filled the well (709). Such heat transfer occurs primarily at the wetted device surface (710). Thermal conduction through the cold plate (701) itself no longer plays a significant role in cooling of the electronic device. The re-entrant flow cold plate, therefore, no longer must be constructed from a thermally conductive material to remain effective. Instead, nearly any material can be used for the re-entrant flow cold plate while still achieving high performance cooling. This allows the re-entrant flow cold plate to be constructed from materials such as metals, ceramics, plastics, or other materials. This material flexibility may greatly reduce the weight of a re-entrant flow cold plate over prior art cold plates.

Figure 8:
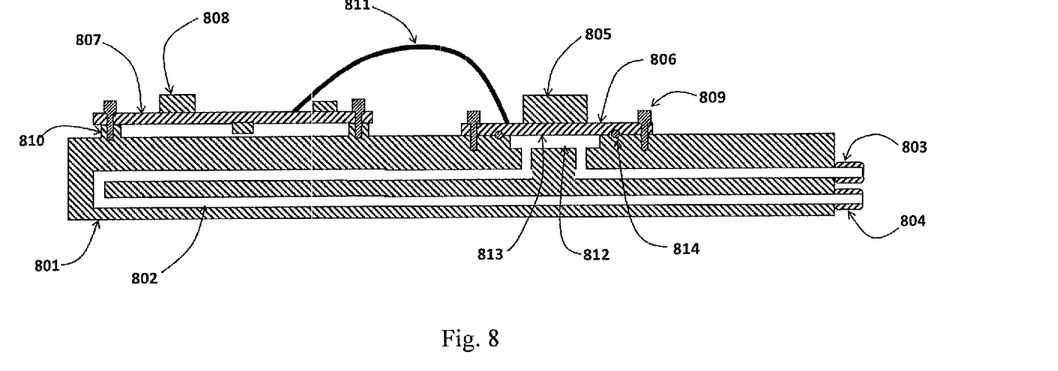
FIG. 8 shows a cross sectional view of a re-entrant flow cold plate that is capable of cooling a combination of components and assemblies.

FIG. 8 shows another embodiment of a re-entrant flow cold plate. Here, the re-entrant flow cold plate has disposed on it more than one electronic device or assembly, as is common when using traditional cold plates. The cold plate (801) includes within it fluid passages (802) that are fed by an inlet (803) and ultimately dispense fluid from an exit (804). In this embodiment, a high power component (805) and its packaging (806) are disposed on the cold plate (801) by fasteners (809) or other common attachment techniques. To address the heat from this high power component, a re-entrant section is introduced, where coolant fluid has exited the surface of the cold plate and filled a well (812) that is bounded on at least one side by the cold plate (801) and on at least one side by the electronic component package (805). High performance heat transfer then occurs at the wetted component surface (813) before the fluid re-enters the cold plate back into fluid passages (802).

An additional element or assembly is also disposed on the same cold plate (801). In this embodiment, a printed circuit board (807) is attached to the cold plate, which may be accomplished by use of fasteners (809) into bosses (810) on the cold plate. Of course, other methods of attachment are possible including standoffs, mounting posts, direct bonding, and others. The printed circuit board (807) may have disposed on it one or more electrical components (808). The plurality of devices or assemblies may be electrically linked, for example, by wires (811).

The additional element disposed on the cold plate may or may not use re-entrant flow for heat transfer. For instance, in the embodiment of FIG. 8, the high performance re-entrant flow has been used for the high power component (805). In this instance, the lower power PCB (807) does not receive the high performance re-entrant flow heat transfer. However, the lower power PCB (807) still benefits from modest cooling commensurate with more traditional cold plate instantiations. That is, re-entrant flow may be used alone in a re-entrant flow cold plate, or may be present in only selected portions of a re-entrant flow cold plate.

Figure 9A:
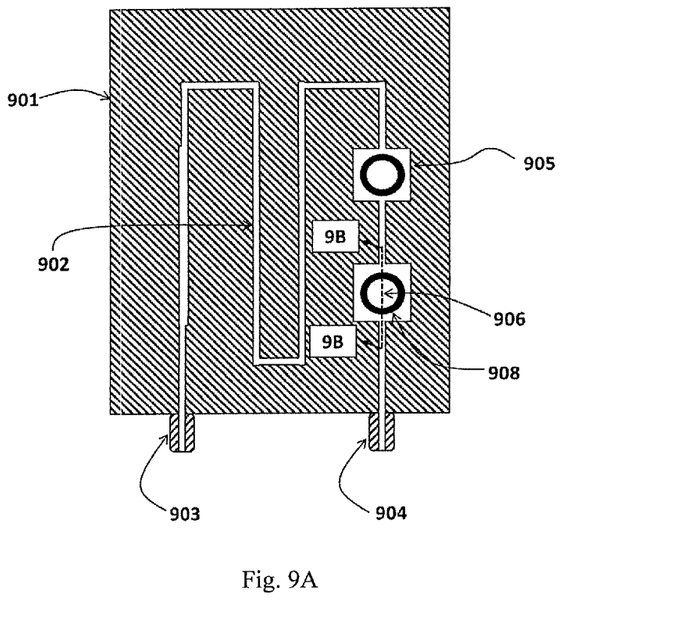
FIG. 9A shows a top view of the fluid passages of a re-entrant flow cold plate.

In FIG. 9A, one possible internal flow geometry of a re-entrant flow cold plate is depicted. The cold plate (901) has disposed within it flow passages (902) that guide coolant fluid from an inlet (904) to an outlet (903). Also disposed on the cold plate (901) are two sections (905) that pass the fluid from within the cold plate to external to the cold plate's outer boundary. These are the sections that would form the external fluid wells. These sections (905) also guide the fluid re-entering the cold plate, back to the internal fluid passages (902). The sections (905) and thus the wells are illustrated in series, meaning that the same fluid passes through both wells.

Figure 9B:
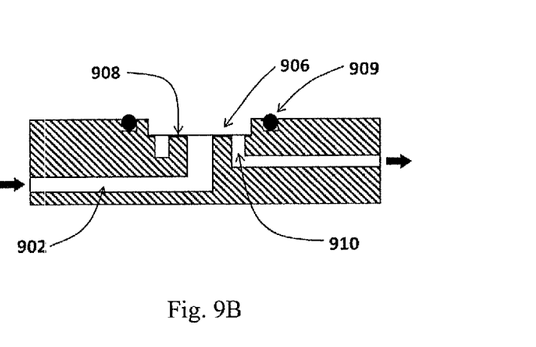
FIG. 9B shows a cross section taken along line 9B-9B of FIG. 9A. Unlike traditional cold plates, at least one section of the re-entrant flow cold plate is not confined to within the plate.

FIG. 9B shows one possible cross sectional view from a cut along line 9B-9B of FIG. 9A. Fluid from internal flow passage (902) feeds an inner annulus that is in communication with the external well (906). When a mating component is attached to the re-entrant flow cold plate, a sealed cavity is formed and this inner well (906) fills with fluid from the internal flow passage (902). Features on the cold plate, for example walls (908), separate the fluid that is exiting the cold plate (into the well) from the fluid that is re-entering (910) the cold plate (from the well). While not depicted in FIG. 9A, there may also be additional features in the cold plate for seals (909) that may be formed or features for mechanically fastening the component to the cold plate (not shown in FIGS. 9A and 9B, but similarly illustrated in FIG. 8 (810)).

Figure 10:
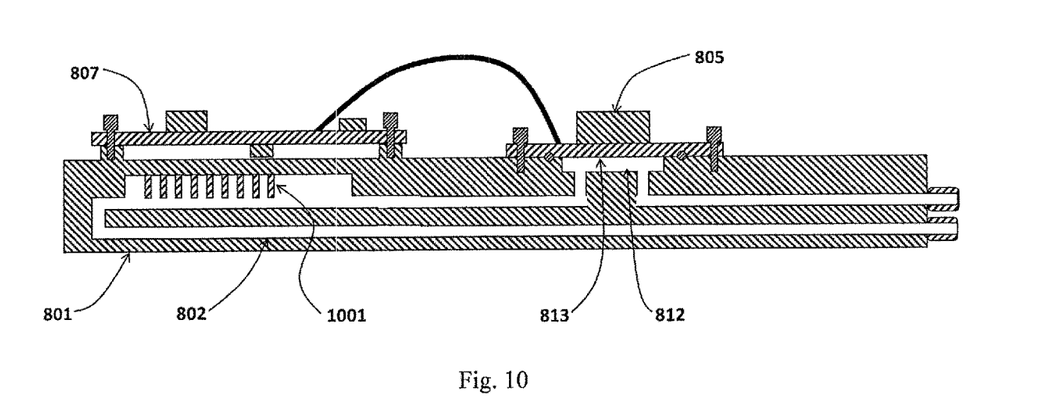
FIG. 10 shows a cross sectional view of one configuration of a re-entrant flow cold plate where the high performance re-entrant section cools a high power component and traditional internal features cool the lower power components or assemblies. This architecture helps to minimize thermal gradients between components of different power levels.

Other embodiments of re-entrant flow cold plates may further utilize the fluid's heat transfer capability while still within the internal fluid passages. FIG. 10 illustrates one such embodiment, where multiple electronic devices or assemblies (807, 805) are disposed on a re-entrant flow cold plate (801). The high power electronic device (805) is disposed on the cold plate (801) such that is benefits from heat transfer associated with the re-entrant flow cold plate's exterior well (812) and the direct fluid contact that occurs at the device's wetted surface (813). After traversing the well (812), the fluid re-enters the cold plate and the internal fluid passages (802).

The fluid in the internal fluid passages (802) may further be used to cool other devices or assemblies disposed on the cold plate, such as a PCB (807). The PCB (807) may or may not be located in close proximity to the high power device (805), but the heat transfer mechanism is separate from the well (812). FIG. 10 illustrates how heat transfer enhancing features (1001) may be disposed within the internal fluid passages (802) to enhance heat transfer of components or assemblies that are not being cooled by the high performance re-entrant flow sections. Such features may increase the surface area and/or create flow turbulence in the part of the cold plate that is close to the component or assembly being cooled. Such features may include, for example, fins, pillars, or surface roughness.

Figure 11:
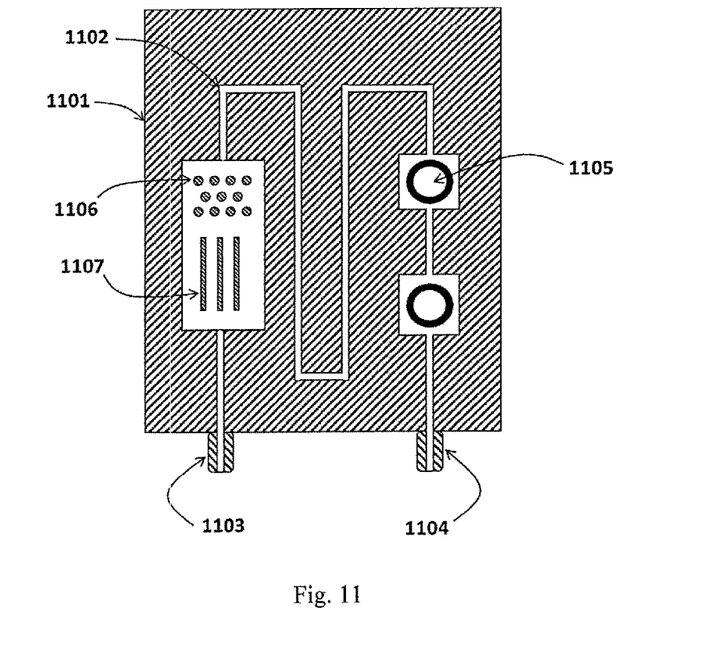
FIG. 11 shows a top view of the fluid passages of a re-entrant flow cold plate, featuring a re-entrant flow section and traditional sections.

FIG. 11 illustrates an embodiment of a re-entrant flow cold plate (1101) where several heat transfer strategies have been included. Between fluid inlet (1104) and fluid exit (1103), the fluid experiences one or more sections of re-entrant flow (1105). The fluid also traverses sections of standard internal fluid conveyance (1102) and may also experience other interior sections of enhanced heat transfer, such as those with internal pillars (1106) or internal fins (1107).

FIG. 12 again illustrates a re-entrant flow cold plate layout where multiple heat transfer approaches have been implemented, including re-entrant flow. In this embodiment there exists a section (1201) with the highest heat transfer performance, comprised of one or more re-entrant flow sections (1105). Also present are internal fluid passages (1102) and a section (1202) of enhanced heat transfer by use of internal features such as pin arrays (1106) or fins (1107). In general, the heat transfer capability of the re-entrant section (1201) is higher than the other sections, including the enhanced internal features section (1202).

Figure 12:
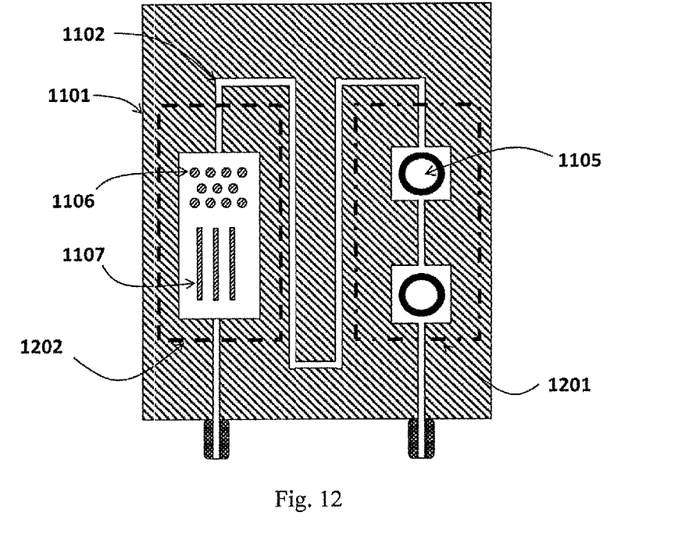
FIG. 12 shows a top view of the fluid passages of a re-entrant flow cold plate, illustrating the re-entrant section for high power components and a separate traditional section for lower power components.

With sections of tailorable heat transfer performance, a re-entrant flow cold plate such as that shown in FIG. 12 can be used to reduce or eliminate thermal gradients across assemblies of varying power levels. For example, a high performance re-entrant flow section (1201) can be located near the highest power component or assembly. Other lower-power components or assemblies may then be cooled, on the same re-entrant cold plate, with lower performance sections such as the internal feature section (1202). In this way, the maximum temperature of the high power component or assembly can be made similar or equivalent to the lower power component or assembly, thereby reducing the thermal gradient between the components or assemblies. Reduction in thermal gradient can have important benefits in reducing stresses in the devices, boards, and structure.

Figure 13:
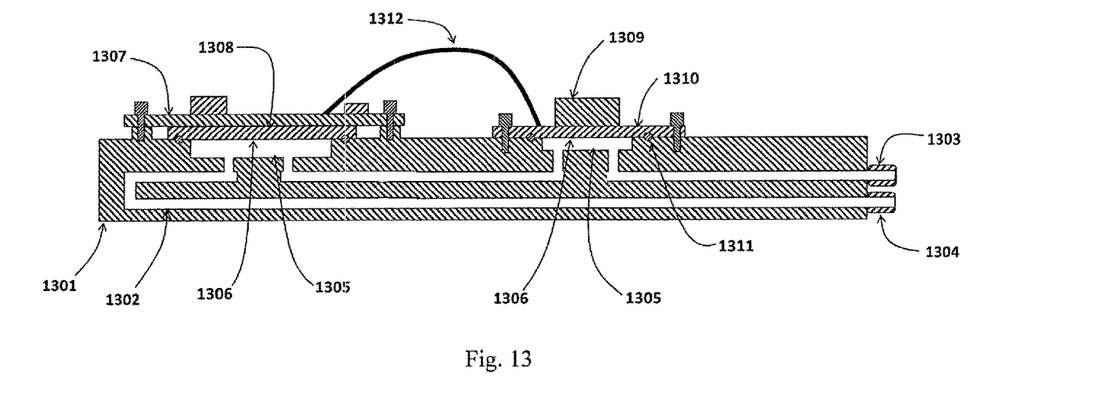
FIG. 13 shows a cross sectional view of a re-entrant flow cold plate featuring multiple re-entrant flow sections.

Of course, the use of re-entrant sections on a re-entrant flow cold plate is not limited to one component or assembly. FIG. 13 illustrates another embodiment of a re-entrant flow cold plate, where multiple components or assemblies utilize the heat transfer effectiveness of the re-entrant flow.

In FIG. 13, the re-entrant flow cold plate (1301) is comprised of internal fluid passages (1302) that connect between one or more fluid inlets (1303) and one or more fluid exits (1304). Disposed on the cold plate (1301) are a high power device, comprised of, for example, an electronic element (1309) and its packaging (1310). Also disposed on the cold plate (1301) is a printed circuit board (1307) with a high power electronic element (1308). The device and PCB may be electrically connected, for example, by use of one or more wire (1312). In this embodiment, re-entrant flow is used to effectively cool both high power elements. Coolant fluid from within the fluid passages (1302) is guided through the surface, exiting the cold plate (1301) and forming an exterior fluid well (1305). Heat is effectively transferred to the coolant fluid, in direct contact with the electronic element (1308) or package (1310), at the wetted surface (1306). After this heat transfer, the coolant fluid then re-enters the cold plate and the internal fluid passages (1302).

Figure 14:
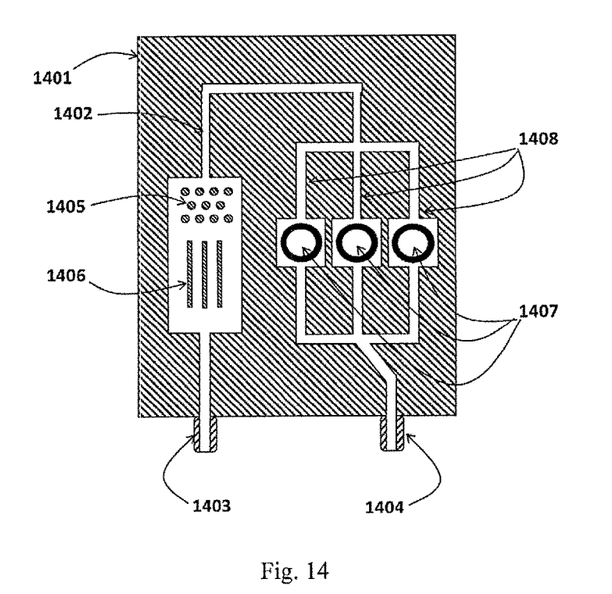
FIG. 14 shows a top view of the fluid passages in a re-entrant flow cold plate, illustrating the parallel flow capability of re-entrant flow sections, reducing overall pressure drop.

For certain embodiments where multiple re-entrant flow sections are implemented, for example those with multiple components or assemblies requiring high performance cooling, the re-entrant flow sections may be fluidically linked in parallel or in series. FIG. 14 illustrates one embodiment of a cold plate (1401) with a plurality of re-entrant flow sections (1407). These re-entrant flow sections (1407) may be fluidically linked through parallel internal flow passages (1408) that are in communication with a primary internal fluid passage (1402), conveying coolant fluid from an inlet (1404) to an outlet (1403). In parallel flow, the fluid flows separately through each well. Parallel connection of the re-entrant flow sections reduces the pressure and flow rate needed for each individual section. Of course, such a cold plate may also include non re-entrant sections (1405, 1406).

For even greater heat transfer performance when using a re-entrant flow cold plate, the re-entrant flow sections may implement enhancements of their own. Such enhancements may include pins, fins, or roughness on the wetted surface of the mating component or assembly. For even greater performance, nozzles may be disposed within the re-entrant cold plate to form fluidic jets, with one such embodiment illustrated in FIG. 15.

Figure 15:
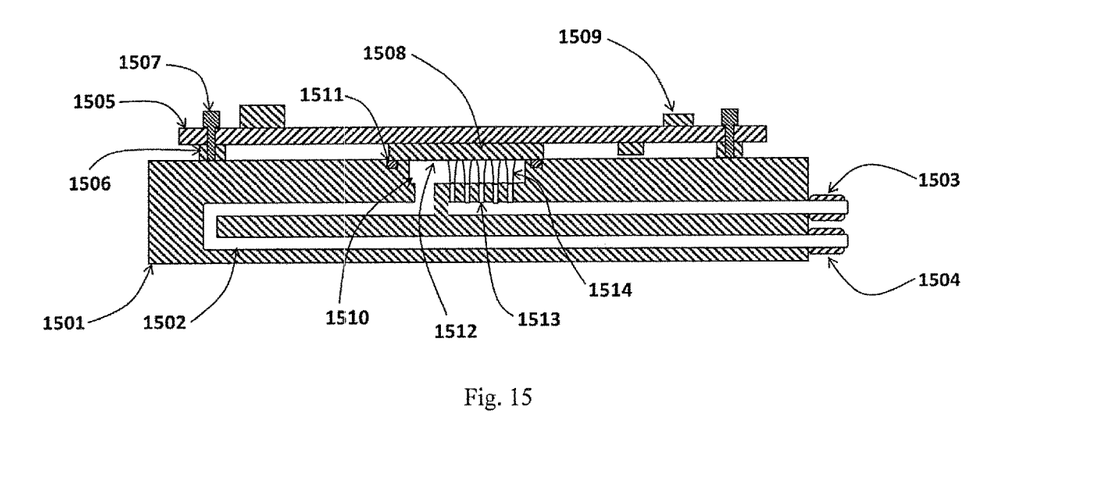
FIG. 15 shows a cross sectional view of one embodiment of a re-entrant flow cold plate where microjet nozzles have been used to enhance the re-entrant flow's cooling effectiveness.

In FIG. 15, a re-entrant cold plate (1501) includes internal fluid passages (1502) for conveyance of coolant fluid from an inlet (1503) to an outlet (1504). Disposed on the cold plate (1501) is a printed circuit board (1505), which may be attached to the cold plate or standoffs (1506) by, for example, fasteners (1507). This PCB (1505) may have disposed on it many components (1509) of varying power level, with at least one component (1508) that requires active cooling. Seals (1511) produce a fluid-tight seal between the high power component (1508) and the re-entrant flow cold plate (1501).

Re-entrant flow is created as coolant fluid from within the cold plate is directed out of, and exits, the boundary of the cold plate (1501), filling an external well (1510). In this embodiment, however, the cold plate has disposed within it a nozzle plate (1513) with one or more orifices or nozzles. The orifices on the nozzle plate may be, for example, circular in cross section with a diameter in the range of 100 µm to 750 µm. Other shapes and diameters are, of course, possible. This nozzle plate (1513) takes the exiting coolant fluid and forms it into one or more fluid jets (1514). The fluid jet may exit at velocities of, for example, 3 m/s to 27 m/s. Other velocities are, of course, possible.

Such microjet cooling is a technique for cooling high-power devices that is characterized by fluid moving through a nozzle to form a small jet of fluid with substantially greater momentum in one direction than another. When this high-momentum fluid impacts a surface, it minimizes the thermal boundary layer at that surface, producing very high heat transfer at that spot. Arrays of microjets can then expand the overall spot size of high heat transfer. Microjet cooling technology has been demonstrated to produce heat transfer coefficients in excess of 200,000 W/m$^2$K, more than 10× that of competing approaches (e.g., microchannels 20,000 W/m$^2$K). This allows the fluid to collect more heat, without the need for additional metal heat spreaders.

The fluid jet or jets (1514) issue into the external well (1510) and strike the wetted surface (1512) of the device to be cooled. Heat is effectively transferred from the component to the fluid. After striking the wetted surface, the jet fluid then occupies the well until it re-enters the cold plate and into the interior fluid passages (1502).

Figure 16:
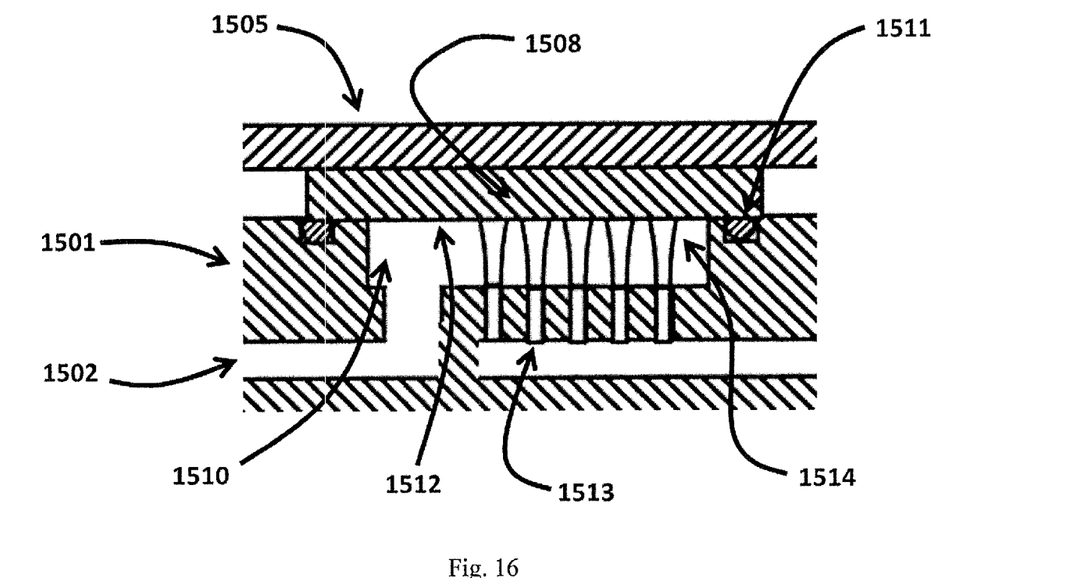
FIG. 16 shows a cross sectional detail view of the assembly in FIG. 15, illustrating the re-entrant flow cold plate's microjet nozzles.

For the embodiment of FIG. 15, FIG. 16 presents a detailed view of the re-entrant flow section. Here, the re-entrant flow cold plate (1501) has disposed within a portion of the outer surface one or more nozzles to form a nozzle plate (1513). Fluid is driven through this nozzle plate, after which the fluid exits the outer boundary of the cold plate (1501) as one or more fluid jets (1514) within the external well (1510). These fluid jets strike at least one outer surface of the component, a wetted surface (1512), transferring heat to the fluid. Fluid from the well then re-enters the cold plate internal fluid passages (1502).

Variations of the assembly are also possible. For example, there may not be a PCB at all, with the electronic element (1508) instead attached to its own package or directly to the cold plate. The microjets formed from the nozzle plate may be oriented to strike perpendicularly to the surface to be cooled, or may be given some nominal angle off perpendicular. Moreover, the surface while shown as flat and smooth, is not limited to such and may include angled sections, roughness, or other features.

In such embodiments containing nozzles or nozzle plates, the nozzles may be disposed in arrays so as to provide cooling for electronic devices of a range of different sizes. Such devices may contain length scales that range from 5-50 mm, for example. Therefore, the size, location, and distribution of nozzles are carefully chosen to provide adequate cooling of the entire device. The nozzles may be disposed in linear arrays, circular arrays, or any other pattern that serves to help cover the surface of the heat-generating devices. The nozzles may be far apart or close together, details of which are carefully chosen in balancing thermofluidic considerations such as, for example, heat transfer and pressure drop.

In certain electronic devices, the heat may not be generated uniformly across the device surface to be cooled. Such sections of the surface where more heat is being generated are therefore more prone to increases in temperature, sometimes referred to as "hot spots". In these cases, it may be advantageous to concentrate nozzles nearer to the hot spots of higher heat generation, while having more sparsity in the array where there is lower or no heat generation. This allows for improved cooling efficiency, as better cooling occurs using the same amount of fluid flow, compared to a case where nozzles are uniformly disposed on the nozzle plate.

In addition to the distribution of nozzles, the size and shape of each individual nozzle may vary across the array to balance tradeoffs of, for example, pressure, flow rate, and heat transfer, with the heat generating character of the electronic device. For example, a set of jets with lower heat transfer capability may be administered around areas of low heat generation, while jets with high heat transfer capability may be administered near hot spots.

Figure 17A:
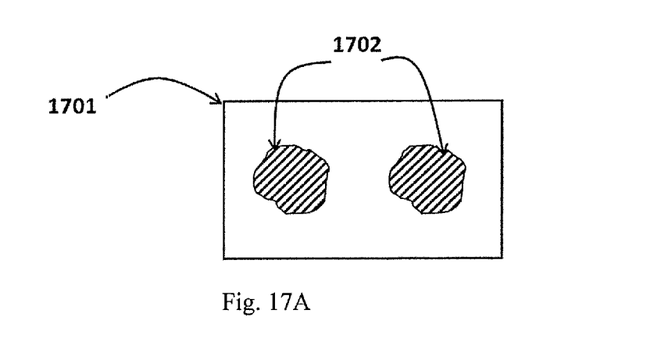
FIGS. 17A and 17B illustrate the use of non-uniform nozzle arrays that may be useful, for example, in cooling electronics "hot spots."
Figure 17B:
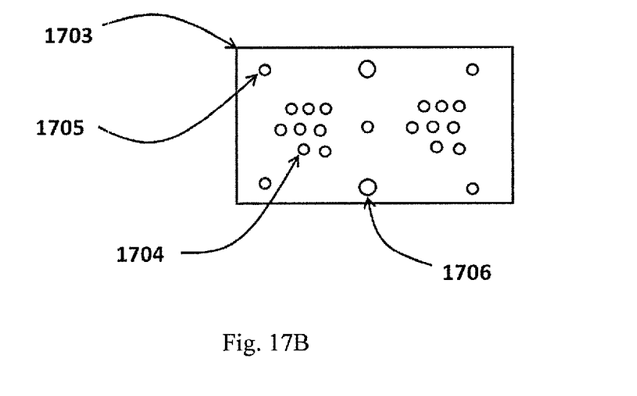

FIGS. 17A and 17B illustrate one possible implementation for matching "hot spots" on the device with the re-entrant flow region (both hot spots comprise 1702). The heat generating device (1701) may have one or more areas (1702) within it that are higher heat dissipation than the rest of the device. The re-entrant flow region (1703) may have an array of nozzles for cooling the device (1701). It may be beneficial to have a non-uniform distribution of nozzles, where nozzles may be arranged in a non-uniform way (1704) to provide better cooling to device hot spots (1702). In other areas, nozzle distribution may, for example, be more sparse (1705) where there is lower heat load, or they may be shaped or sized differently (1706). These non-uniform arrangements may produce more uniform temperatures on the device.

Figure 18A:
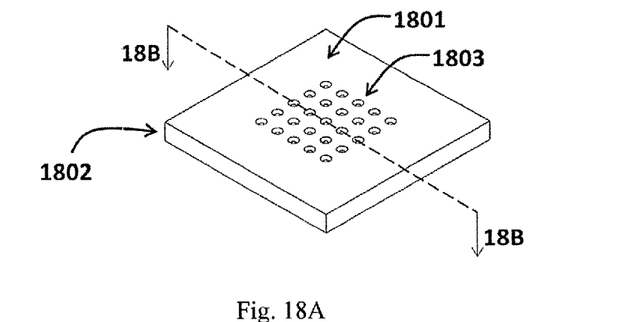
FIG. 18A shows one embodiment of the use of nozzles with geometric features to enhance fluid flow, further depicted in cross-section in FIG. 18B which is taken along line 18B-18B of FIG. 18A.
Figure 18B:
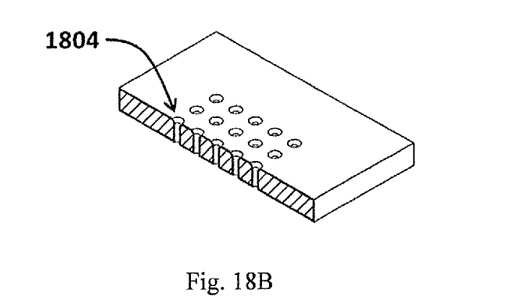

In these and other embodiments, the shape of the nozzle specifically can be carefully chosen to optimize thermofluidic properties, such as pressure drop, flow rate, and heat transfer capability FIG. 18A and FIG. 18B show one embodiment, where a jet nozzle plate (1801) of thickness (1802) has an array of microjet nozzles (1803). By taking a cross section of the nozzle plate (1801), as in FIG. 18B, the nozzle shape becomes visible. By including a chamfered edge (1804) on the exits of the jet nozzles (1803), enhanced fluid flow can result by reducing pressure drop with minimal impact on fluid flow and heat transfer. Note that the geometric features of the chamfer such as angle, depth, and diameter are chosen to produce an optimal desired result. Of course, the geometric features need not be limited to chamfers.

Several methods exist for fabrication of re-entrant flow cold plates. Such cold plates may be constructed as a single monolithic part using, for example, additive manufacturing. They may also be constructed in layers that are later joined using, for example, brazing, welding, or bonding. Of course, as re-entrant flow cold plates relieve the material constraints of thermally conductive metals, other methods using non-metallic materials may also be used, for example plastic molding or 3D printing.

As part of this disclosure, fluid-cooled cold plates (as used in many integrated systems with electronic devices) are constructed where the coolant fluid is not fully contained within the plate but, rather, exits the plate in a controlled fashion to directly wet an accompanying component before re-entering into the cold plate. This approach eliminates two common drawbacks to current cold plates: the need for a thermal interface material and the need for cold plates to be built from heavy, thermally conductive metals. The approach greatly reduces the thermal resistance of cold plates (by avoiding TIM-related losses) and may greatly reduce cold plate weight (by enabling the use of lighter weight and lower conductivity plastics). These re-entrant flow cold plates are designed to take the place of commonly available cold plates in high performance applications.

In one embodiment, the present disclosure discloses a method of cooling electronic devices using a re-entrant flow cold plate. First, the device or its carrier is disposed onto the re-entrant cold plate, with a fluid-tight seal being formed between the device and the cold plate surface. One or more fluid flow passages are disposed within the cold plate, circulating fluid within the cold plate. In at least one instance, fluid is directed from these internal passages to exit the cold plate's outer boundary. The fluid then fills a well formed between the cold plate boundary and at least one surface of the device to be cooled. Fluid in this well wets the at least one surface of the device, transferring heat directly from the device to the fluid (without a need for a thermal interface material). Fluid then re-enters the cold plate, once again joining the fluid passages, taking the heat with it.

The present disclosure is not to be limited in scope by the specific embodiments described herein. Indeed, other various embodiments of and modifications to the present disclosure, in addition to those described herein, will be apparent to those or ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A re-entrant cold plate for cooling at least two separate heat-generating devices, the cold plate defining an external surface and comprising:
   one or more internal fluid passages that are configured to conduct a cooling fluid through the cold plate;
   at least one fluid supply inlet port that is fluidly coupled to the one or more internal fluid passages and is configured to pass the cooling fluid into the one or more internal fluid passages;
   at least one fluid discharge outlet port that is fluidly coupled to the one or more internal fluid passages and is configured to pass the cooling fluid out of the one or more internal fluid passages;
   a first well in the external surface of the cold plate and fluidly coupled to the one or more internal fluid passages, wherein the well is configured to pass the cooling fluid over a portion of the external surface, such that a first heat-generating device that overlies the well is directly contacted by and cooled by the cooling fluid in the first well; and
   multiple spaced attachment structures exposed to the external surface of the cold plate, wherein one or more first attachment structures are configured to be coupled to the first heat-generating device, to hold the first heat-generating device directly over the first well, and one or more second attachment structures that are configured to be coupled to a second heat-generating device such that the second heat-generating device is configured to be cooled by the cooling fluid.

2. The re-entrant cold plate of claim 1, further comprising a nozzle plate comprising one or more nozzles, the nozzle plate being configured to form cooling fluid jets that issue into the well.

3. The re-entrant cold plate of claim 2, wherein the one or more nozzles are non-uniformly configured, to reduce temperature gradients across the first heat-generating device.

4. The re-entrant cold plate of claim 3, wherein the one or more nozzles are non-uniformly distributed.

5. The re-entrant cold plate of claim 3, wherein the one or more nozzles are non-uniform in size.

6. The re-entrant cold plate of claim 2, wherein the one or more nozzles contain geometric features for enhanced fluid flow.

7. The re-entrant cold plate of claim 6, wherein the geometric features comprise chamfered edges that serve to reduce pressure drop through the one or more nozzles.

8. The re-entrant cold plate of claim 1, further comprising a fluid-tight seal between the cold plate and the first heat-generating device.

9. The re-entrant cold plate of claim 8, wherein the fluid-tight seal comprises an elastomeric O-ring or gasket.

10. The re-entrant cold plate of claim 1, wherein the well is configured with a fluid inlet that is fluidly coupled to a first internal fluid passage of the one or more internal fluid passages and a fluid outlet that is spaced from the fluid inlet and fluidly coupled to a second internal fluid passage of the one or more internal fluid passages.

11. The re-entrant cold plate of claim 10, wherein all of the cooling fluid flowing through the one or more internal fluid passages flows through the well.

12. The re-entrant cold plate of claim 10, wherein only some of the cooling fluid flowing through the one or more internal fluid passages flows through the well.

13. The re-entrant cold plate of claim 1, further comprising a second well in the external surface of the cold plate, wherein the first and second wells are separate.

14. The re-entrant cold plate of claim 13, wherein the first and second wells are arranged in series such that the cooling fluid flows through the first well and then flows through the second well.

15. The re-entrant cold plate of claim 13, wherein the first and second wells are arranged in parallel such that the cooling fluid flows through each of the wells separately.

16. The re-entrant cold plate of claim 1, wherein the second heat-generating device is configured to be cooled by the cooling fluid flowing through at least one of the one or more internal fluid passages.

17. The re-entrant cold plate of claim 1, fabricated using additive manufacturing.

18. The re-entrant cold plate of claim 1, made from a non-metal material.

19. A re-entrant cold plate for cooling at least two separate heat-generating devices, the cold plate defining an external surface and comprising:
   one or more internal fluid passages that are configured to conduct a cooling fluid through the cold plate;
   at least one fluid supply inlet port that is fluidly coupled to the one or more internal fluid passages and is configured to pass the cooling fluid into the one or more internal fluid passages;
   at least one fluid discharge outlet port that is fluidly coupled to the one or more internal fluid passages and is configured to pass the cooling fluid out of the one or more internal fluid passages;
   a first well in the external surface of the cold plate and fluidly coupled to the one or more internal fluid passages, wherein the well is configured to pass the cooling fluid over a portion of the external surface, such that a first heat-generating device that overlies the well is directly contacted by and cooled by the cooling fluid in the first well;
   a nozzle plate that is configured to form cooling fluid jets that issue into the well;
   a fluid-tight seal between the cold plate and the first heat-generating device; and
   multiple spaced attachment structures exposed to the external surface of the cold plate, wherein one or more first attachment structures are configured to be coupled to the first heat-generating device, to hold the first heat-generating device directly over the first well, and one or more second attachment structures that are configured to be coupled to a second heat-generating device such that the second heat-generating device is configured to be cooled by the cooling fluid.

* * * * *